United States Patent
Leidl et al.

(10) Patent No.: US 7,345,409 B2
(45) Date of Patent: Mar. 18, 2008

(54) ELECTRODE STRUCTURE FOR ELECTRO-ACOUSTIC COMPONENT AND METHOD FOR PRODUCING SAID STRUCTURE

(75) Inventors: Anton Leidl, Hohenbrunn (DE); Ulrich Knauer, München (DE); Werner Ruile, München (DE); Lijun Peng, Augsburg (DE)

(73) Assignee: EPCOS AG, Munich (DE)

( * ) Notice: Subject to any disclaimer, the term of this patent is extended or adjusted under 35 U.S.C. 154(b) by 19 days.

(21) Appl. No.: 10/504,625

(22) PCT Filed: Feb. 7, 2003

(86) PCT No.: PCT/DE03/00363

§ 371 (c)(1),
(2), (4) Date: Nov. 7, 2005

(87) PCT Pub. No.: WO03/069775

PCT Pub. Date: Aug. 21, 2003

(65) Prior Publication Data

US 2006/0175639 A1    Aug. 10, 2006

(30) Foreign Application Priority Data

Feb. 15, 2002    (DE) ................ 102 06 369

(51) Int. Cl.
*H01L 41/08* (2006.01)
(52) U.S. Cl. ............... 310/364; 310/313 A; 310/334
(58) Field of Classification Search .......... 310/313 A, 310/364
See application file for complete search history.

(56) References Cited

U.S. PATENT DOCUMENTS

| | | | |
|---|---|---|---|
| 5,774,962 A | | 7/1998 | Satoh et al. |
| 5,844,347 A | * | 12/1998 | Takayama et al. ...... 310/313 R |
| 5,909,156 A | | 6/1999 | Nishihara et al. |
| 6,377,138 B1 | * | 4/2002 | Takagi et al. ............... 333/193 |
| 6,486,591 B2 | | 11/2002 | Nishihara |
| 7,109,828 B2 | * | 9/2006 | Takayama et al. .......... 333/193 |
| 7,148,610 B2 | * | 12/2006 | Jacot et al. ................. 310/364 |
| 2001/0052736 A1 | * | 12/2001 | Iwamoto et al. ........ 310/313 B |
| 2002/0074904 A1 | * | 6/2002 | Watanabe et al. ........... 310/364 |
| 2002/0195675 A1 | | 12/2002 | Hakamada |
| 2003/0155844 A1 | * | 8/2003 | Anasako ..................... 310/364 |

FOREIGN PATENT DOCUMENTS

| | | |
|---|---|---|
| DE | 101 38 810 A1 | 7/2002 |
| EP | 0 762 641 A1 | 3/1997 |
| EP | 0 803 919 A1 | 10/1997 |
| EP | 0 936 734 A1 | 8/1999 |

(Continued)

OTHER PUBLICATIONS

J.Y. Kim and H.J. Kim: "Passivation Layer Effects on Power Durability of Saw Duplexer", 1999 IEEE, Ultrasonics Symposium, pp. 39-42.

(Continued)

*Primary Examiner*—Mark Budd
(74) *Attorney, Agent, or Firm*—Schiff Hardin LLP

(57) ABSTRACT

For a component operating with acoustic waves, it is proposed to arrange the electrode structure over a mechanically stable adaptation layer that serves to dissipate the electromechanical stresses. Further improvements of the output compatibility are achieved with additional intermediate layers and passivation layers applied on the sides or the entire surface over the electrode structure.

12 Claims, 2 Drawing Sheets

FOREIGN PATENT DOCUMENTS

EP      0 803 919 B1     6/2001

OTHER PUBLICATIONS

Satoh et al: "Ladder Type Saw Filter And Its Application to High Power Saw Devices", International Journal of High Speed Electronics and Systems, vol. 10, No. 3 (2000) 825-865.

Takayama et al: "High Power SAW Filter With New Al-Sc-Cu/Ti/Al-Sc-Cu/Ti Electrodes", 1998 IEEE Ultrasonics Symposium, pp. 5-8.

Takayama et al: "High Power Durable Electrodes for GHZ Band SAW Duplexers", preprint IEEE Ultrasonics Symposium 2000.

* cited by examiner

ELECTRODE STRUCTURE FOR ELECTRO-ACOUSTIC COMPONENT AND METHOD FOR PRODUCING SAID STRUCTURE

BACKGROUND OF THE INVENTION

1. Field of the Invention

The present invention generally relates to a component operating with acoustic waves, and in particular to an electro-acoustic component with a piezoelectric substrate on which an electrode structure that includes aluminum is applied.

2. Description of the Related Art

Components that operate with acoustic waves include surface acoustic wave components (SAW components) and FBAR resonators (film bulk acoustic resonator). SAW filters and filters made from FBAR resonators are increasingly being used in the front end of mobile radio devices as transmitting and receiving filters. The entire transmission capacity of the mobile radio device flows through the transmission filter, such that the electrode structures of these components are exposed to a maximum current load. Moreover, due to the increasing miniaturization of mobile telecommunications devices and due to the introduction of new mobile radio standards, the power density in the components is ever higher. In addition to requiring a high current load capacity of the electrode structures, the acoustic waves in these devices subject the electrodes to a strong mechanical stress that can in the long term lead to destruction of the electrode structure and, as a result, to the failure of the component or, respectively, the filter.

Tests of mechanically and electrically severely stressed filters show that the electrodes are destroyed by material migration of the electrode material (acousto- and electromigration). These material migrations manifest themselves as the formation of voids and, on the surface of the electrode structures, as in the formation of outgrowths that are known as hillocks. FIG. 1 shows an electrode structure of a SAW component damaged by acousto-migration. The strip-shaped electrode structures ES (here shown in cross-section) are applied on a substrate S. From the originally rectangular cross-section of the electrode strips, the outgrowths H have formed via acousto-migration, the electrode structures being capable of occurring both on the side of the electrode structures and on the upper surface of the electrode structures. The voids V form parallel to this. An electrode structure which has thus been modified possesses a changed geometry whose electromechanical properties are changed. If outgrowths H are formed between two oppositely charged electrode fingers, these can be the origin of a short or an arc-over between the two electrode fingers. In addition to the modified properties of the damaged electrode structure, an electrical arc-over between different polarized electrode fingers typically leads to the destruction and thus to the total failure of the filter. In contrast, the modification (increasing under stress load) of the electromechanical properties of electrode structures leads to a continuous change of the resonance frequency and to an unwanted rise in the insertion damping.

Aluminum is typically used as an electrode material in SAW components. To limit the damaging acousto-migration, alloys of, for example, AlCu, AlMg, AlCuMg, AlCuSc, AlZrCu, AlTi, AlSi and others are increasingly being used. These alloys reduce the migration, in that they form deposits at the aluminum crystal borders that block the diffusion paths. Dependent on the metal or element added to the aluminum, this leads to the added element being fixed in the aluminum crystals, reinforcing the crystals and reducing the material migration in the electrodes. More detailed information concerning such electrode structures or, respectively, of the materials used for them are located in the printed publications U.S. Pat. No. 5,774,962; R. Takayama et al., "High Power Durable Electrodes for GHz Band SAW Duplexers"; and R. Takayama et al., "High Power SAW Filters with New Al—Sc—Cu/Ti/Al—Sc—Cu/Ti Electrodes." By suppressing the acousto-migration, both the continuous change of the resonance frequency and the insertion damping and the danger of the short formation and the arc-overs are counteracted. However, the alloys used have a higher specific electrical resistance than non-alloyed metals. This impairs the filter performance and effects a higher insertion damping. Moreover, the spontaneous heating is increased, which in turn has a negative effect on the output tolerance of the electrode structures and thus the filter. The maximum output tolerance is therewith also limited with the proposed alloys.

Furthermore, it has been proposed to use layer systems made from different metals and aluminum alloys instead of a homogenous layer made from aluminum or an aluminum alloy. For this, one or more intermediate layers made from copper, magnesium, titanium, chromium or other metals are used between aluminum and/or aluminum alloy layers. These intermediate layers block the diffusion of the aluminum through these layers and reduce the effect of the continuous change of the resonance frequency and the insertion damping. This is, for example, proposed in the printed publications Y. Satoh et al., "Ladder Type SAW Filter and Its Application to High Power SAW Devices"; and U.S. Pat. No. 5,909,156.

In order to increase the bonding of the electrode structures on the substrate, a bonding layer made from titanium can be applied between the undermost aluminum or aluminum alloy layer, as is known, for example, in U.S. Pat. No. 5,844,347; and European Patent Publication EP 0803919 B1. This titanium bonding layer improves the <111>— texture and therewith the output compatibility.

Furthermore, it has already been proposed to use pure copper to produce electrode structures, or alternatively to use a layer system of copper-aluminum or copper-aluminum-copper. Independently of this, it has been proposed to generate large-area passivation layers over the electrode structures in order to protect the electrode structures from external effects such as corrosion and to prevent the migration. Silicon dioxide, silicon nitride and aluminum nitride have already been proposed as materials for such a passivation layer, for example in the printed publication J. Kim et al., "Passivation Layer Effects on Power Durability of SAW Duplexer.".

SUMMARY OF THE INVENTION

The present invention improves the output compatibility of the electrode structures in a component having acoustic waves or an acoustic resonator structure.

This and other objects and advantages of the invention are achieved by a component operating with acoustic waves. The component includes a piezoelectric substrate on which is applied an electrode structure that includes aluminum. A mechanically stable adaptation layer is arranged beneath the electrode structure to increase the output compatibility of the electrode structure. A bonding agent layer is disposed between the adaptation layer and piezoelectric substrate.

The bonding agent layer may either have a thickness of between 1 to 10 nm, or may be made of $Al_2O_3$ or TiO.

A method is also provided for producing a component wherein a thin aluminum is applied to a piezoelectric substrate and is oxidized on the substrate to form a bonding layer of one embodiment. Subsequently, an adaptation layer and electrode structure are applied. The bonding layer which is provided either has a thickness of between 1 to 10 nm, or is formed of either $Al_2O_3$ or TiO.

In the following, the method to produce the inventive electrode structure is explained in detail using exemplary embodiments and six associated Figures. Using schematic drawings not drawn to scale, the Figures show various embodiments of the invention in comparison with an electrode structure damaged by acousto-migration.

DETAILED DESCRIPTION OF THE PREFERRED EMBODIMENTS

Figure 1:
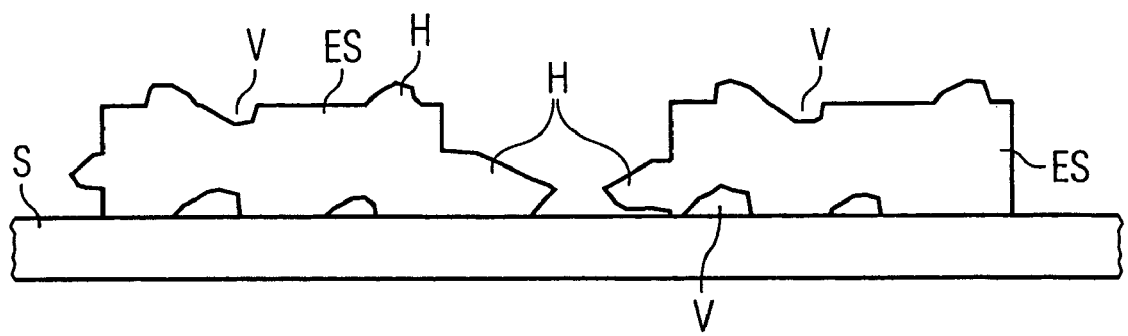
FIG. 1 is a side elevational view in cross section of a prior art electrode structure after acousto-migration has occurred.

Embodiments of the invention provide a mechanically stable adaptation layer beneath the electrode structure. With a suitably selected adaptation layer, the acousto-migration is successfully suppressed. Corresponding experiments by the inventor have shown that the danger of shorts and arc-overs is particularly high when an aluminum layer or an aluminum alloy layer is used as a first layer over the piezoelectric substrate. From simulation calculations, it has emerged that the mechanical load (mechanical stress and expansion) due to the acoustic wave is primarily highest at the transition substrate/metallization, and that the aluminum or, respectively, aluminum alloy cannot sufficiently withstand this load.

Therefore, as an adaptation layer a material is used which significantly reduces the mechanical load in the remaining electrode structure (which still comprises aluminum or an aluminum alloy) and that can itself in turn withstand the mechanical loads. A further constraint for the selection of the material for the adaptation layer is a good bonding to the substrate and/or to the electrode material applied over it. Thus, in a first approximation all materials are suitable that show a lower material fatigue and that exhibit a higher break-yield limit than the aluminum or, respectively, aluminum alloy previously used for electrode structures. Copper is particularly suited for the adaptation layer. Copper exhibits a good bonding to the material of the remaining electrode structure and shows a good electrical conductivity. The bonding to the piezoelectric substrate material, for example lithium tantalite, lithium niobate, quartz or langasite, is reduced in comparison to aluminum.

In an embodiment of the invention, a bonding agent layer is provided between the adaptation layer of copper and the substrate, the bonding agent layer imparting a good bonding both to the substrate and to the adaptation layer. Such a bonding agent layer can include a titanium layer. An aluminum oxide layer (whose usability as a bonding agent layer was previously unknown) is also particularly well-suited. Moreover, further bonding agent layers are suitable that, in addition to the bonding, must exhibit no further special properties. The bonding agent layer can correspondingly be applied in an extremely small layer thickness of a few atom layers and, for example, at a layer thickness of 1 to 10 nm.

In principle, no electrode properties are required for the adaptation layer; however, they are advantageous. Dependent on the electrical conductivity of the material used for the adaptation layer, only a sufficient minimum layer thickness is necessary. If the adaptation layer has good electrode properties, it can also be correspondingly fashioned thicker than necessary. A sufficient thickness of the adaptation layer is already achieved at 2 to 30 nm, independent of its material.

In addition to the copper, titanium alloys, magnesium and titanium nitrite are, for example, proposed for the adaptation layer. In all cases, a reduced acousto-migration relative to known electrode structures is expected, and therewith an improved resistance with regards to a change of its properties or with regard to a total failure.

A further improvement of the output capability is achieved when the acousto-migration within the part of the electrode structure still comprising aluminum or an aluminum alloy is additionally suppressed via blocking layers.

In an advantageous embodiment of the invention, an intermediate layer which can deploy a diffusion blocking effect is arranged between two respective layers comprising aluminum or an aluminum alloy. With the aid of such intermediate layers, the acousto-migration is suppressed perpendicular to these blocking layers, thus typically vertical to the substrate. In particular, copper, magnesium, magnesium oxide, titanium, titanium nitride or a titanium alloy are suitable as a material for such intermediate layers. Here as well it is true that the thickness of the intermediate layer is determined dependent on the suitability of the material of the intermediate layer as an electrode layer. For materials with worse electrode properties than aluminum, the thickness ratio of the at least one intermediate layer is adjusted to, for example, 10 percent with regard to the total layer thickness of the electrode structure. However, if the electrode properties of the material of the intermediate layer are better than that of the remaining electrode structure, higher thickness rations of the intermediate layer are also suitable.

Via insertion of the intermediate layer, it is achieved as a further advantage that the remaining aluminum or aluminum alloy layers can now only form even smaller crystal diameters in the metallic structure. Via insertion of intermediate layers, the aluminum or the aluminum alloy layer is advantageously set to a minimum value that is above the charge carrier mobility within the material, in order to not effect an increase of the electrical resistance via too-thin aluminum layers.

Given corresponding thickness of the entire electrode structure, which is dependent on the frequency at which the component operates, a plurality of intermediate layers can also be provided in the electrode structure in order to effect both a reduced vertical diffusion (via the diffusion blocking effect) and a reduced horizontal diffusion (via the smaller crystal diameter). These layers are only of advantage as intermediate layers, meaning when they are bordered on both sides by corresponding electrode layers, thus by aluminum layers or aluminum alloy layers. If such a layer were to be used as a cover layer (an uppermost layer) of the electrode structure, this would only develop a slight diffusion blocking effect. In addition to this, a further lithography step would be necessary for electrical contacting. Also, no diffusion blocking layer is necessary as a lowermost layer since no diffusion occurs in the substrate or, respectively, in the bonding agent or the adaptation layer.

In a further advantageous embodiment of the invention, diffusion hindering the output capability of the electrode structure is further suppressed by a passivation layer. This can be applied over the whole surface on the substrate, such that it covers the electrode structure as well as the regions of the substrate not covered by the electrode structure. Electrically non-conductive passivation layers are in particular suitable for this embodiment.

However, it is particularly advantageous to initially apply the passivation layer over the whole surface and to subsequently anisotropically etch until the passivation layer is removed over the electrode structures and the electrode material there is uncovered. The surface of the substrate between the electrode structures is also uncovered at the same time. However, the passivation layer remains on the side edges of the electrode structure and forms spacers.

Given a suitable selection of the material for the passivation layer, in this manner a horizontal diffusion of electrode material is prevented, such that in particular no hillocks can form on the side. The susceptibility to shorts is therewith significantly reduced. Since the surface of the electrode structures is in this manner also free of a covering, the acousto-mechanical behavior of the electrode structures provided with spacers is also practically not influenced.

The diffusion of electrode material in all directions is also suppressed given whole-surface application of the passivation layer over the electrode structures. A negative influence on the electromechanical properties of the electrodes or, respectively, of the electrode structure is minimized by monitored layer deposition of the passivation layer. A damping of the acoustic wave via the coating of the electrode structure with the passivation layer can thus be largely suppressed.

Practically all at least high-resistance materials that can be homogenously deposited in an edge-covering manner are considered as materials for the passivation layer. However, the materials $SiO_2$, SiC, $Si3N4$, DLC (diamond-like carbon), TiO or MgO are preferred. However, in principle other high-resistance or insulating materials are also suitable.

Figure 2:
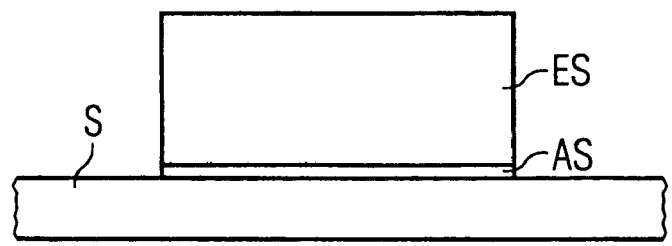
FIG. 2 is a side elevational view in cross section of a first embodiment of an electrode according to the principles of the present invention and including an adaptation layer.

FIG. 2 shows the simplest embodiment of the invention. An electrode structure ES is arranged on a piezoelectric substrate S, for example a piezoelectric crystalline wafer made from lithium tantalate or lithium niobate or a piezoelectric thin layer, for example made from zinc oxide or aluminum nitride. Depending on the type of component, in the case of a SAW component this is, for example, a strip-shaped finger electrode; in the case of an FBAR resonator, this is an electrode applied in a planar fashion. The electrode structure ES predominantly comprises aluminum or an aluminum alloy, for example an aluminum copper alloy with up to two percent copper. To achieve an optimal coupling with the substrate, the electrode structure ES exhibits an optimal thickness dependent on the wavelength. For a 1 GHz component, for example a 1 GHz SAW filter, the optimal thickness is at approximately 400 nm. For a 2 GHz filter, the optimal layer thickness is lower and is at approximately 180 nm. Given application of an HF signal to the electrode as well as a counter-electrode (which is located on the same surface of the substrate S in a SAW component and, conversely, on the opposite surface of the substrate S in an FBAR resonator), an acoustic wave is excited in the substrate. Solely due to the oscillations in the substrate, severe mechanical stress of the electrode structure ES occurs that is always stronger in the electrode at the substrate surface. An adaptation layer AS is therefore inventively arranged the between electrode layer ES and substrate S. This can be applied directly on the substrate and possesses a thickness of, for example, more than 2 nm, Given a layer thickness above 30 nm, no further improvement of the electrode structure is observed with regard to its output compatibility and its short resistance. However, it is fundamentally possible to also make the adaptation layer thicker. The adaptation layer is preferably comprised of copper in a layer thickness of approximately 2 to 30 nm.

Figure 3:
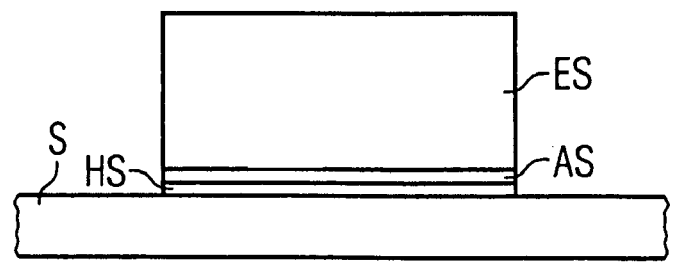
FIG. 3 is a side elevational view in cross section of a second embodiment of an electrode structure of the present invention and including an additional bonding layer.

Due to the poor bonding of copper on prevalent substrate materials such as lithium niobate or lithium tantalate, a bonding agent layer HS is provided between substrate S and adaptation layer AS, as shown in FIG. 3. A few atom layers are sufficient for the thickness of the bonding agent layer; a preferred layer thickness is therefore in the range of 1 to 5 nm. The bonding agent layer HS is, for example, comprised of a thin aluminum oxide layer, for whose application it is sufficient to apply a correspondingly thin aluminum layer on the oxidic piezoelectric substrate. This aluminum layer is completely oxidized with oxygen from the oxidic substrate and is thus converted into an aluminum oxide layer. For the bonding agent layer HS, other materials are also suitable that exhibit sufficient bonding to the substrate S and to the adaptation layer HS. Larger layer thicknesses are possible but not necessary.

Figure 4:
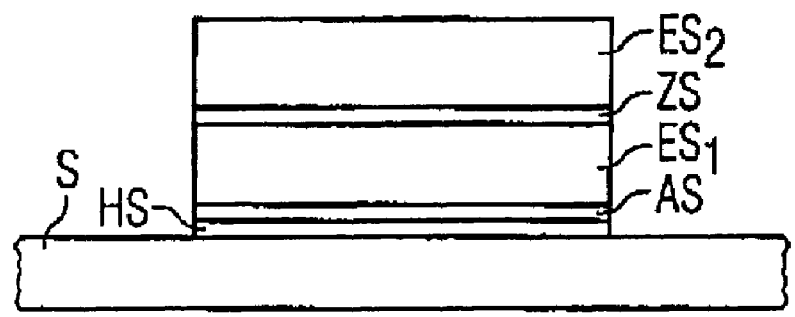
FIG. 4 is a side elevational view and cross section of a further embodiment of an electrode structure of the invention, including an additional intermediate layer.

FIG. 4 shows a further embodiment of the invention in which the electrode structure ES comprising aluminum or an aluminum alloy is divided by an intermediate layer ZS per into two or more sub-layers ES1 and ES2. The intermediate layer, comprising for example of 10 to 40 nm of copper, serves as a diffusion blocking layer, such that an acousto-migration of aluminum atoms from the electrode structure in the vertical direction is prevented by this intermediate layer S. However, it is also possible with the intermediate layer S to divide two sub-layers ES1 and ES2 made from different electrode materials from one another in order to also here prevent a diffusion of electrode material between the sub-layers.

A diffusion of aluminum atoms from the electrode structure ES is nearly completely prevented when a passivation layer PS is applied over the electrode structure ES together with an intermediate, adaptation and bonding agent layer possibly arranged therein. Like all other layers applied on the substrate, this layer can also be applied with a thin layer method, for example via sputtering, evaporation or CVD methods. Preferred as a passivation layer is an oxide layer of silicon, titanium or magnesium, a silicon nitride layer or an SIC or DLC layer. Other oxidic or insulating materials are also possible.

Figure 5:
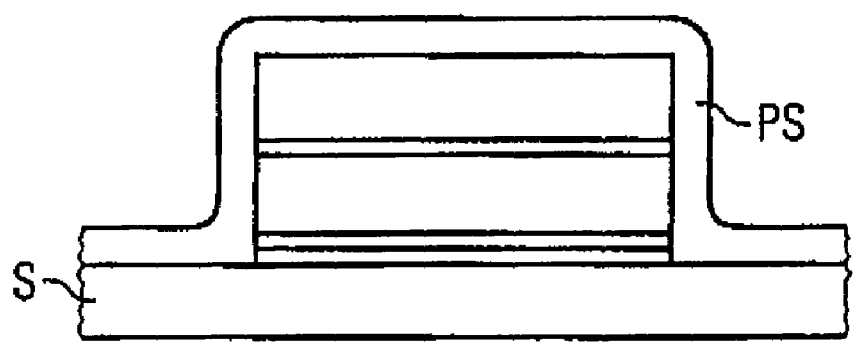
FIG. 5 is a side elevational view in cross section showing yet another embodiment of the electrode structure of the invention, which includes a further passivation layer.

The formation of hillocks is completely prevented by the complete surface covering. The formation of voids inside the electrode structure is also correspondingly suppressed. FIG. 5 shows such an electrode structure covered with a passivation layer.

Figure 6:
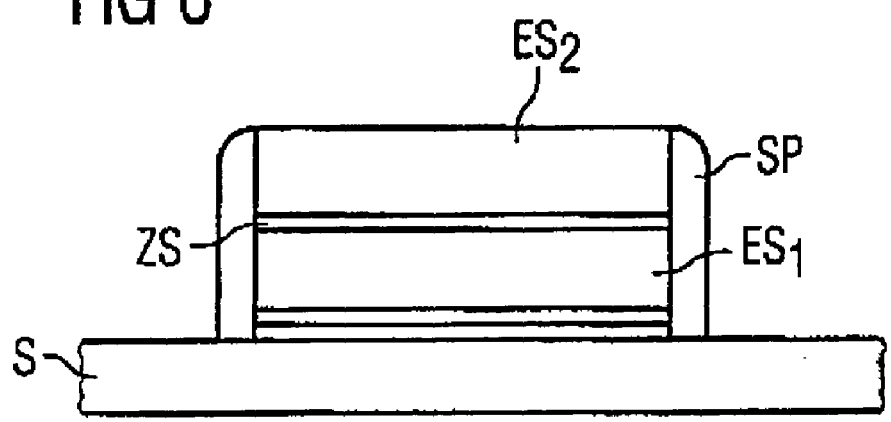
FIG. 6 is a side elevational view in cross section showing an embodiment of the electrode structure of the invention which includes spacers.

Via anisotropic etching of this electrode structure with a maximum etching rate vertical to the substrate surface for a span of time that is sufficient to remove the layer thickness of the passivation layer, the layer portions of the passivation layer aligned parallel to the substrate surface are completely removed. FIG. 6 shows that the spacer SP remains only on the side surfaces of the electrode structure. The passivation layer is completely removed from the surface of the electrode structure and lateral to the electrode structure beyond the spacer SP. In this manner, an electrode structure completely surrounded by spacers on its side edges is attained in which the acousto-migration is prevented in the horizontal direction parallel to the substrate surface, that on the other hand, however, shows no covering of the electrode on the surface and therefore does not impair the electromechanical properties that are necessary for the use of the electrode structure to generate acoustic waves.

In addition to the exemplary embodiments shown in Figures, it is also possible for individual layers to use materials other than those specified, which then must satisfy the constraints mentioned previously in the specification. It is also possible to omit several of the shown layers in inventive electrode structures. For example, it is possible to apply the passivation layer on electrode structures as it is shown in FIGS. 2 and 3. Insofar as sufficient bonding is provided between the substrate and the adaptation layer AS, the bonding agent layer HS can be foregone. All layers are applied in thin layer methods, whereby both a lift-off method and an etching method can be used for structuring of the electrode structure ES. While a sacrificial layer is applied in the lift-off method in the regions of the substrate surface that should remain free of electrodes, the sacrificial layer being removed again (together with layer regions lying above it) after whole-surface application of the desired electrodes and other layers, in the etching technique all layers are initially generated over the entire surface atop one another and are subsequently structured via etching, for example with the aid of a photoresist mask. The passivation layer is preferably generated after the structuring of the electrode structure.

The invention is particularly preferably used in SAW components, in particular in SAW filters, that are subject to high electromechanical stress, increased material fatigue with consequences like susceptibility to shorts, and continuous change of the filter properties. With the invention, these components achieve an improved output compatibility that shows in a higher constancy of the component properties and in an increased resistance to shorts. The improvements are achieved via the adaptation layer in which a part of the mechanical stress is dissipated, such that it can no longer affect the electrode structure subject to acousto-migration. In connection with the further measures, such as the intermediate layers and the passivation layer or the spacers, the acousto-migration, which is possibly still present in spite of reduced stress, is further reduced. With the invention, the characteristic values for output capability are more than doubled without negatively influencing the remaining component properties.

Although other modifications and changes may be suggested by those skilled in the art, it is the intention of the inventors to embody within the patent warranted hereon all changes and modifications as reasonably and properly come within the scope of their contribution to the art.

The invention claimed is:

1. A component operating with acoustic waves, comprising:
    a piezoelectric substrate;
    a bonding layer directly on said piezoelectric substrate, said bonding layer consisting of one of $Al_2O_3$ and TiO, said bonding layer being of a layer thickness of 1 to 10 nm;
    an adaptation layer directly on said bonding layer, said adaptation layer comprising one of copper, a titanium alloy, magnesium, and titanium nitride; and
    an electrode structure on said piezoelectric substrate, said electrode structure comprising a layer of aluminum directly on said adaptation layer.

2. A component operating with acoustic wave as claimed in claim 1, wherein said bonding layer is of $Al_2O_3$ and said adaptation layer is of copper.

3. A component according to claim 1, wherein said adaptation layer comprises copper.

4. A component according to claim 1, wherein adaptation layer comprises one of titanium alloy, magnesium and titanium nitride.

5. A component according to claim 1, wherein said adaptation layer has a layer thickness in a range of 2 to 30 nm.

6. A component according to claim 1, wherein said electrode structure is a multi-layer electrode structure, said multi-layer structure including an intermediate layer arranged between two sub-layers, comprising one of aluminum and an aluminum alloy.

7. A component according to claim 6, further comprising: a diffusion blocking layer as an intermediate layer.

8. A component according to claim 7, wherein said intermediate layer is comprised of a material selected from Cu, Mg, MgO, Ti, titanium nitride and a titanium alloy.

9. A component according to claim 8, wherein said intermediate layer has a thickness as a proportion of 1 to 10% of a total thickness of said electrode structure.

10. A component according to claim 1, further comprising:
    a passivation layer over said electrode structures.

11. A component according to claim 10, wherein said passivation layer is comprised of a material selected from $SiO_2$, SiC, $Si_3N_4$, DLC, TiO and MgO.

12. A component according to claim 10, wherein said electrode structure is covered with said passivation layer on side surfaces disposed transverse to a main surface of said substrate, a surface of said electrode structure disposed parallel to the main surface of said substrate being free of said passivation layer.

* * * * *